(12) United States Patent
Anthony et al.

(10) Patent No.: US 6,819,586 B1
(45) Date of Patent: Nov. 16, 2004

(54) THERMALLY-ASSISTED MAGNETIC MEMORY STRUCTURES

(75) Inventors: Thomas C. Anthony, Sunnyvale, CA (US); Manoj K. Bhattacharyya, Cupertino, CA (US); Janice H. Nickel, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/692,841

(22) Filed: Oct. 24, 2003

(51) Int. Cl.$^7$ ................................................ G11C 11/14

(52) U.S. Cl. .................... 365/171; 365/145; 365/158
(58) Field of Search ............................. 365/171, 145, 365/158, 173; 257/295, 427

(56) References Cited

U.S. PATENT DOCUMENTS

| | | |
|---|---|---|
| 6,385,082 B1 | 5/2002 | Abraham et al. |
| 6,404,674 B1 | 6/2002 | Anthony et al. |
| 6,552,926 B2 | 4/2003 | Komori |
| 6,603,678 B2 | 8/2003 | Nickel et al. |
| 6,724,674 B2 * | 4/2004 | Abraham et al. ............ 365/211 |
| 2003/0198113 A1 * | 10/2003 | Abraham et al. ............ 365/211 |

* cited by examiner

*Primary Examiner*—Vu A. Le

(57) ABSTRACT

An exemplary array of thermally-assisted magnetic memory structures, each of the memory structures comprises a memory cell, a write conductor contacting the memory cell, the write conductor selecting the memory cell in a first coordinate during a write operation, and a heating system contacting the memory cell. The heating system heats the memory cell during the write operation and selects the memory cell by the heating in a second coordinate.

33 Claims, 6 Drawing Sheets

THERMALLY-ASSISTED MAGNETIC MEMORY STRUCTURES

BACKGROUND

A memory chip generally comprises a plurality of memory cells that are deposited onto a silicon wafer and addressable via an array of column conducting leads (bit lines) and row conducting leads (word lines). Typically, a memory cell is situated at the intersection of a bit line and a word line. The memory cells are controlled by specialized circuits that perform functions such as identifying rows and columns from which data are read from or to which data are written. Typically, each memory cell stores data in the form of a "1" or a "0," representing a bit of data.

An array of magnetic memory cells can be referred to as a magnetic random access memory or MRAM. MRAM is generally nonvolatile memory (i.e., a solid state chip that retains data when power is turned off). At least one type of magnetic memory cell includes a data layer and a reference layer, separated from each other by at least one intermediate layer. The data layer may also be referred to as a bit layer, a storage layer, or a sense layer. In a magnetic memory cell, a bit of data (e.g., a "1" or "0") may be stored by "writing" into the data layer via one or more conducting leads (e.g., a bit line and a word line). A typical data layer might be made of one or more ferromagnetic materials. The write operation is typically accomplished via a write current that sets the orientation of the magnetic moment in the data layer to a predetermined direction.

Once written, the stored bit of data may be read by providing a read current through one or more conducting leads (e.g., a read line) to the magnetic memory cell. For each memory cell, the orientations of the magnetic moments of the data layer and the reference layer are either parallel (in the same direction) or anti-parallel (in different directions) to each other. The degree of parallelism affects the resistance of the cell, and this resistance can be determined by sensing (e.g., via a sense amplifier) an output current or voltage produced by the memory cell in response to the read current.

More specifically, if the magnetic moments are parallel, the resistance determined based on the output current is of a first relative value (e.g., relatively low). If the magnetic moments are anti-parallel, the resistance determined is of a second relative value (e.g., relatively high). The relative values of the two states (i.e., parallel and anti-parallel) are typically different enough to be sensed distinctly. A "1" or a "0" may be assigned to the respective relative resistance values depending on design specification.

The intermediate layer, which may also be referred to as a spacer layer, may comprise insulating material (e.g., dielectric), non-magnetic conducting material, and/or other known materials, The various conducting leads which are used to select the memory cells (e.g., bit lines, word lines, and read lines), and to provide currents to pass through the data and reference layers to read data from or write data to the memory cells are provided by one or more additional layers, called conducting layer(s).

The layers described above and their respective characteristics are typical of magnetic memory cells based on tunneling magnetoresistance (TMR) effects known in the art. Other combinations of layers and characteristics may also be used to make magnetic memory cells based on TMR effects. See, for example, U.S. Pat. No. 6,404,674, issued to Anthony et al., which is hereby incorporated by reference in its entirety for all purposes.

Still other configurations of magnetic memory cells are based on other well known physical effects (e.g., giant magnetoresistance (GMR), anisotropic magnetoresistance (AMR), colossal magnetoresistance (CMR), and/or other physical effects).

Throughout this application, various exemplary embodiments will be described in reference to the TMR memory cells as first described above. Those skilled in the art will readily appreciate that the exemplary embodiments may also be implemented with other types of magnetic memory cells known in the art (e.g., other types of TMR memory cells, GMR memory cells, AMR memory cells, CMR memory cells, etc.) according to the requirements of a particular implementation.

Conventional MRAM as described above generally has the magnetic memory cell situated at the intersection of a pair of orthogonal metal write conductors (i.e., a bit line and a word line). In this arrangement, the magnetic memory cells are in good thermal contact with the write conductors. Such good thermal contact keeps the temperature of the magnetic memory cells low because heat generated in the magnetic memory cells is rapidly dissipated by the write conductors. However, if one desires to elevate the temperature of the magnetic memory cells, the good thermal contact becomes a disadvantage. This is the case in thermally-assisted MRAM, where temperature of a selected memory cell in a magnetic memory cell is elevated during a write operation to facilitate switching of its magnetic orientation.

Thus, a market exists for improved thermally-assisted magnetic memory structures.

SUMMARY

An exemplary array of ther thermally-assisted magnetic memory structures, each of the magnetic memory structures comprises a memory cell, a write conductor contacting the memory cell, the write conductor selecting the memory cell in a first coordinate during a write operation, and a heating system contacting the memory cell. The heating system heats the memory cell during the write operation and selects the memory cell by the heating in a second coordinate.

An exemplary method for making a thermally-assisted magnetic memory structure comprises forming a memory cell, forming a write conductor contacting the memory cell, the write conductor selecting the memory cell in a first coordinate during a write operation, and forming a heating system contacting the memory cell. The heating system heats the memory cell during the write operation and selects the memory cell by the heating in a second coordinate.

Other embodiments and implementations are also described below.

DETAILED DESCRIPTION

I. Overview

Exemplary improved thermally-assisted magnetic memory structures are described herein.

Section II describes an exemplary improved thermally-assisted magnetic memory structure.

Section III describes an exemplary array of thermally-assisted magnetic memory structures implementing a first exemplary heating system.

Section IV describes an exemplary thermally-assisted magnetic memory structure implementing a second exemplary heating system.

Section V describes another exemplary thermally-assisted magnetic memory structure implementing a third exemplary heating system.

II. An Exemplary Thermally-Assisted Magnetic Memory Structure

A. Thermally-Assisted Magnetic Memory Structures in a Conventional MRAM Configuration In many conventional MRAMs, a "1" or a "0" is written into a memory cell in an individual memory structure by switching the magnetic orientation of the data layer in the memory cell. The magnetic orientation is typically switched by the vector sum of magnetic fields resulting from write currents flowing in two orthogonal write conductors (i.e., a bit line and a word line), one above and one below the memory cell. The selected memory cell experiences a bit line field and a word line field, while other memory cells on the selected row and column experience only one of a bit line field and a word line field.

Figure 1:
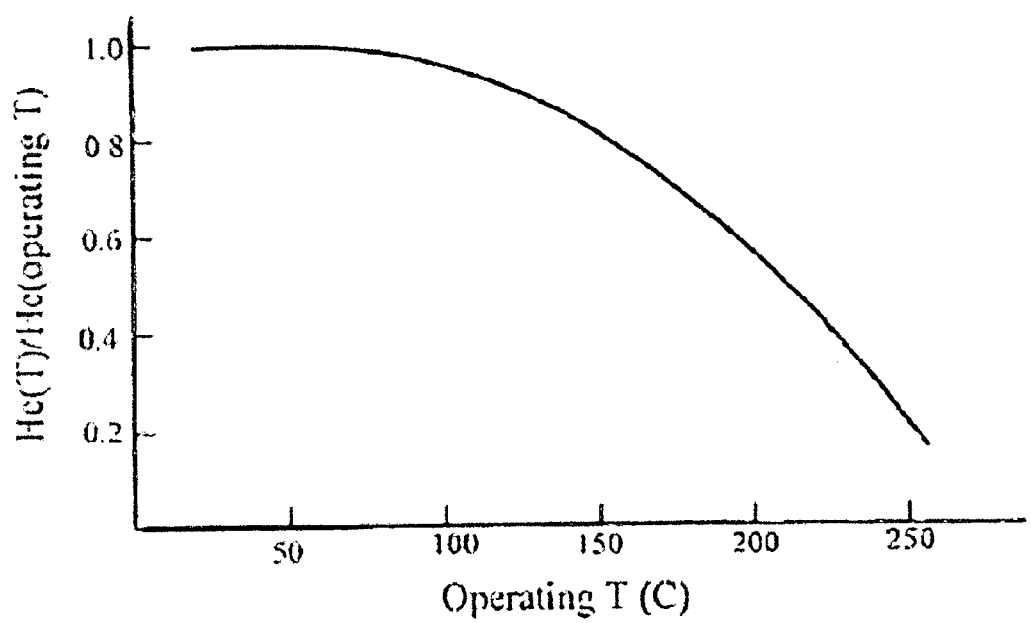
FIG. 1 illustrates an exemplary graph of coercivity versus temperature of an exemplary thermally-assisted magnetic memory structure.

In a thermally-assisted (but otherwise conventional) MRAM, a selected memory cell is heated just prior to or during a write operation. As a result of the increased heat, the coercivity (i.e., the ease of switching the magnetic orientation of the memory cell) of the heated memory cell is reduced and smaller switching magnetic fields (thus, smaller currents) are required to write that memory cell. FIG. 1 illustrates an exemplary graph of coercivity versus temperature for a thermally-assisted memory cell. The particular data in FIG. 1 are merely exemplary, and will vary depending on the composition and other characteristics of the memory cell. In general, however, as the temperature in the memory cell increases, the coercivity in the memory cell generally decreases.

Thus, a thermally-assisted conventional MRAM generally requires smaller combined x- and y-fields to switch than memory cells in a non-thermally-assisted conventional MRAM.

B. Improved Thermally-Assisted Magnetic Memory Structures in a MRAM Configuration that Eliminates One Write Conductor The conventional magnetic memory structure can be simplified by eliminating one of the write conductors from the thermally-assisted MRAMs. By applying heat to a selected memory cell, the required switching magnetic fields are reduced during a write operation. For example, as long as a selected memory cell is heated enough (i.e., to a threshold temperature without irreversibly altering magnetization properties), a write current applied in one write conductor can be enough to switch the magnetic orientation of the heated memory cell, without switching the magnetic orientation of unheated memory cells on the selected write conductor.

Eliminating one write conductor may also reduce power dissipation, simplify manufacturing processes, reduce the probability of writing errors into half-selected memory cells, and/or reduce wasted current on unselected memory cells.

The amount of energy needed to heat memory cells to a certain temperature, T, is proportional to the number of memory cells selected. Thus, if a single memory cell is selected, the amount of energy required to heat that selected memory cell can be very small.

In an exemplary implementation, a particular memory cell can be selected by using one write conductor to supply a write current in the column where the memory cell is situated, and by using heat to select the memory cell on the appropriate row along that column. The coercivity of the heated memory cell is reduced below the level of field provided by the write current, whereas the coercivities of the unheated memory cells are above the provided field.

Figure 2:
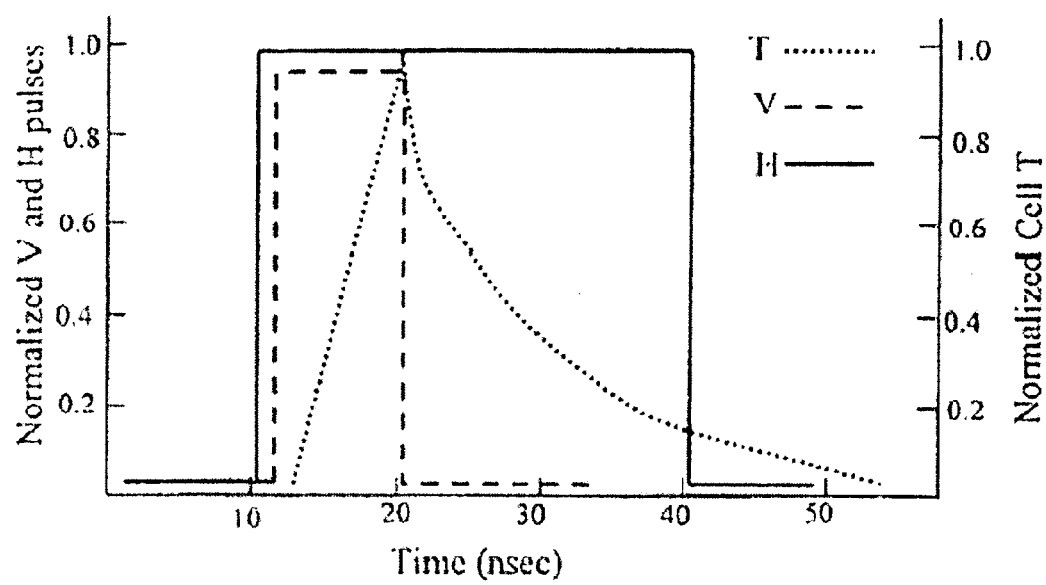
FIG. 2 illustrates an exemplary timeline of a write operation of an exemplary thermally-assisted magnetic memory structure.

FIG. 2 illustrates an exemplary timeline for writing a memory cell in an improved thermally-assisted MRAM. The particular data in FIG. 2 are merely exemplary, and will vary depending on the characteristics of the memory structure. The solid line indicates the write current applied over time. The dashed line indicates heating power applied to the memory cell over time. The dotted line indicates the rise and fall of the temperature in the memory cell due to the applied heating power over time. For example, during a write operation, a voltage pulse can be applied to the memory cell while applying a write current in a selected write conductor (along the column where the heated memory cell is located). The voltage pulse heats the memory cell to a temperature such that the coercivity of the memory cell decreases. While the memory cell is hot, the write current is applied for a length of time sufficient to write the memory cell and is maintained until the memory cell cools back down to a thermally stable magnetization condition.

Figure 3:
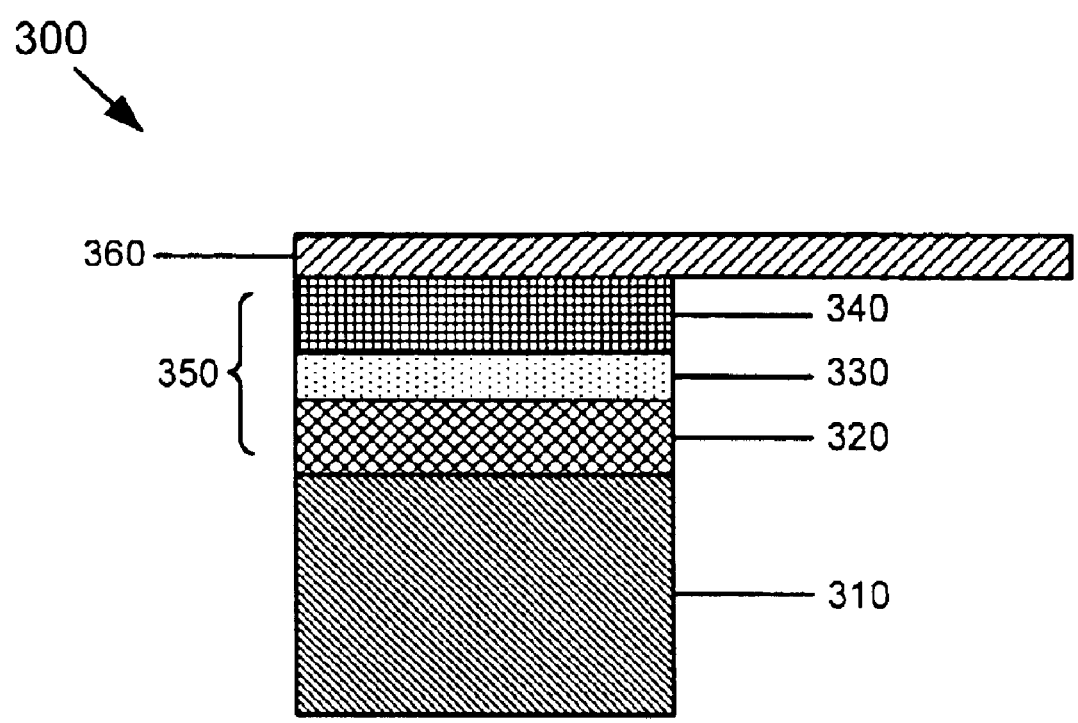
FIG. 3 illustrates an exemplary thermally-assisted magnetic memory structure.

C. An Exemplary Thermally-Assisted Magnetic Memory Structure with One Write Conductor FIG. 3 illustrates an exemplary improved thermally-assisted magnetic memory structure 300. Generally, a memory structure may be made in a top-pinned configuration (where the reference layer is on top of the data layer) or a bottom-pinned configuration (where the reference layer is below the data layer). For ease of explanation, only the top-pinned configuration is shown in FIG. 3 and referenced in the description of various exemplary embodiments herein. One skilled in the art will readily appreciate that other configurations (e.g., bottom-pinned, etc.) may also be implemented using the exemplary processes disclosed herein in accordance with any particular design requirement.

The magnetic memory structure 300 includes a write conductor 310, a memory cell 350 (including a data layer 320, a spacer layer 330, and a reference layer 340), and a heating system 360.

Memory structures having additional layers are also known in the art and may be implemented with various embodiments to be described herein in accordance with a particular design choice. For example, another magnetic memory structure may also include a seed layer, an antiferromagnetic (AFM) layer, a protective cap layer, and/or other layers. The seed layer enhances crystalline alignment within the AFM layer. Exemplary materials for a seed layer include Ta, Ru, NiFe, Cu, or combinations of these materials. The AFM layer enhances magnetic stability in the reference layer 340. Exemplary materials for an AFM layer include IrMn, FeMn, NiMn, PtMn, and/or other well known materials. The protective cap layer protects the data layer 320 from the environment (e.g., by reducing oxidation of the data layer 320) and may be formed using any suitable material known in the art. Exemplary materials for a protective cap layer include Ta, TaN, Cr, Al, Ti, and/or still other materials. For ease of explanation, these additional layers are not shown in the Figures.

Referring back to FIG. 3, in an exemplary implementation, the write conductor 310 and the heating system 360 are orthogonal to each other and are used for write and read operations. For example, during a write operation, a write current applied in a selected write conductor 310 effectively selects a column of memory cells and heat provided by the heating system 360 selects the row location of the memory cell along that selected column. The physical configuration of the write conductor 310 and the heating system 360 described above is merely exemplary. One skilled in the art will readily appreciate that the write conductor 310 and the heating system 360 do not necessarily have to be orthogonal to each other as long as, during a write operation, the write conductor 310 selects the memory cell 350 in a first coordinate and the heating system 360 selects the memory cell 360 in a second coordinate by heating the memory cell 350 during the write operation. The first and the second coordinates may be positioned at any angle relative to each other.

During a read operation, the heating system 360 can be used as a read conductor and the write conductor 310 can be used as a sense line. In this exemplary implementation, the heating system 360 supplies a small read current to the selected memory cell 350 and output current from the selected memory cell 350 exits to a selected write conductor 310 to be provided to standard sense circuitry (not shown) for sensing the resistance in the memory cell 350. Additional exemplary heating systems will be described in Sections III–V below.

The write conductor 310 may be made of Cu, Al, AlCu, Ta, W, Au, Ag, alloys of one or more of the above, and/or other conducting material(s) and alloy(s). The write conductor 310 may be formed by deposition or other techniques known in the art (e.g., sputtering, evaporation, electroplating, etc.). The write conductor 310 as shown in FIG. 3 is merely illustrative. Those skilled in the art will appreciate that other configurations can also be implemented in accordance with any particular design choice. For example, the write conductor 310 may be at least partially cladded by a ferromagnetic cladding material, the write conductor 310 may be thermally insulated from the memory cell by an insulating material (e.g., dielectric, air, a vacuum, etc.), etc. If a cladding is implemented, the cladding may comprise one or more materials having low thermal conductivity (e.g., amorphous metallic, doped semiconductor, and/or other materials or alloys) and/or ferromagnetic properties. In addition, the memory cell 350 may make electrical contact with a portion of the cladding instead of the write conductor 310 to reduce heat transfer through the write conductor 310.

Writing the memory cell 350 using a single write conductor 310 does not preclude using magnetic fields generated by other layers near the selected memory cell 350 to assist the writing process. For example, when a small current is applied via the heating system 360 to heat the memory cell 350, small magnetic fields will result from that current. The magnetic fields generated by the heating system 360 may be combined with the magnetic fields generated by the write current in the write conductor to write the memory cell. For example, the small boost in magnetic fields from the heating system 360 may help reduce the write current needed in the write conductor 310 during a write operation. One skilled in the art will readily appreciate that other configurations may also be implemented in accordance with any particular design choice.

In an exemplary implementation, the heating system 360 may comprise a conductor contacting the memory cell 350 and/or other components (e.g., standard switching circuitry, and/or other configurations) for supplying energy (e.g., current) to heat the memory cell 350. The conductor implemented in a heating system 360 may comprise one or more of Ti, Cu, Al, AlCu, Ta, W, alloys of one or more of the above, and/or other conducting material(s) and alloy(s). The heating system 360 may also comprise standard circuitry (not shown) for controlling energy (e.g., amount, duration, timing, etc.) to be used to heat the memory cell 350. If the heating system 360 is being used as a read conductor, the standard circuitry may allow a read current to be applied to the memory cell 350 during read operations. The heating system 360 may be connected to a single memory cell or multiple memory cells. Various exemplary heating systems 360 will be described in Sections III–V below. The heating system 360 may also be implemented in accordance with other known techniques. For example, see U.S. Pat. No. 6,603,678 B2, entitled "Thermally-Assisted Switching of Magnetic Memory Elements," issued to Nickel et al., which is hereby incorporated by reference for all purposes.

The data layer 320 may comprise one or more ferromagnetic materials. In an exemplary embodiment, ferromagnetic materials suitable for the data layer 320 include, without limitation, NiFe, NiFeCo, CoFe, amorphous ferromagnetic alloys (e.g., CoZrNb, CoFeB), and other materials. In an exemplary implementation, the data layer 320 comprises a ferromagnet (FM) in contact with an antiferromaget (AFM). By coupling a FM layer to an AFM layer, a desired temperature dependence of the data layer coercivity may be obtained. For example, high coercivity may be achieved at room temperature due to a large FM-AFM exchange anisotropy. High room temperature coercivity may prevent inadvertent writing of unselected memory cells on selected rows and/or columns. Examples of AFM materials include, without limitation, iridium manganese (IrMn), iron manganese (FeMn), nickel manganese (NiMn), nickel oxide (NiO) and platinum manganese (PtMn), and/or other materials.

In an exemplary embodiment, the spacer layer 330 is a tunnel barrier layer (e.g., if the memory cell 350 is a TMR memory cell). In this embodiment, the spacer layer 330 may be made of $SiO_2$, $SiN_x$, MgO, $Al_2O_3$, $AlN_x$, and/or other insulating materials.

In another exemplary embodiment, the spacer layer 330 is a non-magnetic conducting layer (e.g., if the memory cell 350 is a GMR memory cell). In this embodiment, the spacer layer 330 may be made of Cu, Au, Ag, and/or other nonmagnetic conducting materials.

The reference layer 340 may comprise a single layer of material or multiple layers of materials. For example, the reference layer 340 may comprise one or more ferromagnetic materials. In an exemplary embodiment, ferromagnetic materials suitable for the reference layer 340 include NiFe, NiFeCo, CoFe, , amorphous ferromagnetic alloys (e.g., CoZrNb, CoFeB), and other materials.

Figure 4:
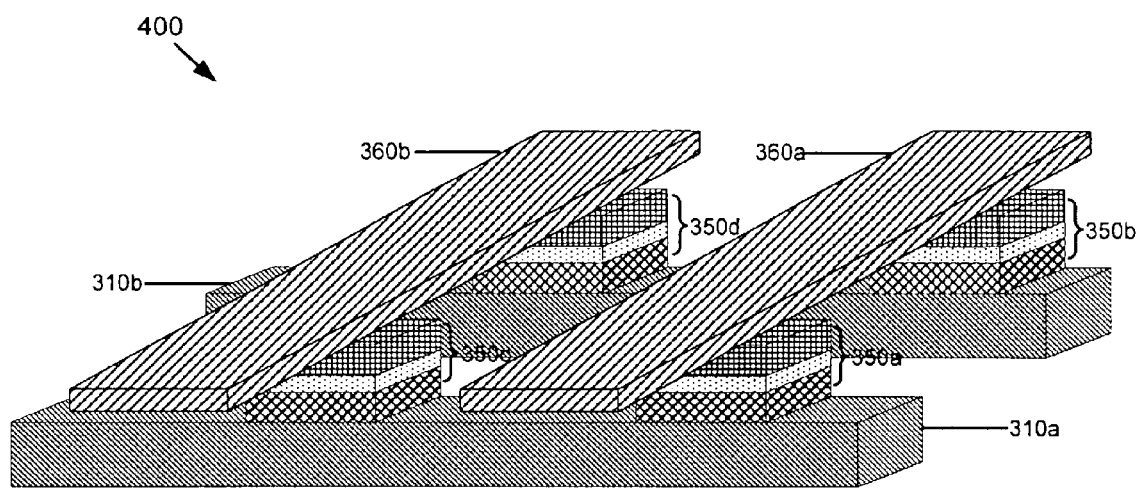
FIG. 4 illustrates an exemplary array of thermally-assisted magnetic memory structures implementing a first exemplary heating system.

III. An Exemplary Array of Thermally-Assisted Magnetic Memory Structures Implementing a First Exemplary Heating System FIG. 4 illustrates an exemplary array of thermally-assisted magnetic memory structures 400 implementing a first exemplary heating system. The array 400 includes write conductors 310a, 310b, memory cells 350a–350d contacting the write conductors 310a, 310b, and heating systems 360a, 360b contacting the memory cells 350a–350d. In this exemplary implementation, the heating systems 360a, 360b comprise heater lines that are orthogonal to the write conductors

310a, 310b. Each heater line provides heat to at least one memory cell 350a–350d in the array 400, for example, during a write operation. The heater lines may be connected to standard circuitry (not shown) for controlling the timing and amount of heat applied to one or more memory cells 350a–350d. Standard circuitry for controlling heater lines is well known in the art and need not be described in more detail herein. See, for example, U.S. Pat. No. 6,603,678 B2 referenced above.

During a write operation, write current runs in a selected write conductor 310a, and heater current is applied to a selected heater line 360a to heat the line (and memory cells 350a and 350b adjacent to this line). In this manner, memory cell 350a located at the intersection of the selected write conductor 310a and selected heater line 360a is selected and written. The memory cell 350a should be heated enough so that magnetic field generated by the write current in the selected write conductor 310a is sufficient to switch the memory cell's magnetic orientation. However, the memory cell 350a should not be overheated as to irreversibly alter its magnetization properties. In an exemplary implementation, the write current may be maintained for some time during a write operation until the written memory cell 350a cools to a magnetically stable temperature.

In the embodiment shown in FIG. 4, multiple memory cells share a heater line so more than one memory cell experiences an elevated temperature during a write operation. In this exemplary embodiment, it may be efficient to write to all of the memory cells along the heated row simultaneously. For example, referring to FIG. 4, memory cells 350a and 350b are heated when heater line 360a draws heater current. To write both memory cells, write current is applied simultaneously to write conductors 310a and 310b. The direction of write current in conductors 310a and 310b determines the magnetic state of the written memory cells.

During a read operation, the write conductors 310a, 310b and heater lines 360a, 360b function as sense lines. For example, to read memory cell 350a, a small read current is applied to a selected heater line 360a, through the memory cell 350a, and through a selected orthogonal write conductor 310a. The current through the selected memory cell 350a is dependent on the magnetic state (i.e., the resistance) of the memory cell 350a. Thus, the memory cell 350a situated at the intersection of the selected heater line 360a and the selected write conductor 310a is read.

Figure 5:
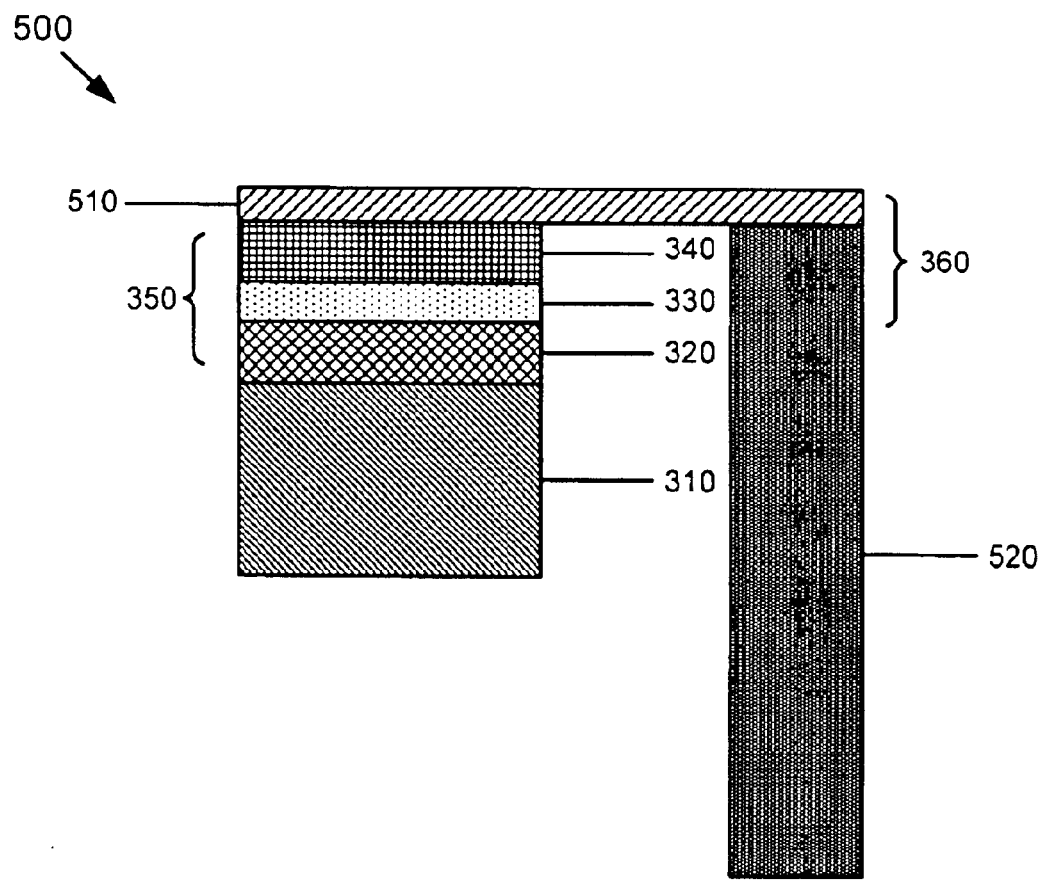
FIG. 5 illustrates an exemplary thermally-assisted magnetic memory structure implementing a second exemplary heating system.

IV. An Exemplary Thermally-Assisted Magnetic Memory Structure Implementing a Second Exemplary Heating System FIG. 5 illustrates an exemplary thermally-assisted magnetic memory structure 500 implementing a second exemplary heating system. The memory structure 500 includes a write conductor 310, a memory cell 350 contacting the write conductor 310, and a heating system 360 contacting the memory cell 350. In this exemplary implementation, the heating system 360 comprises a read conductor 510 connected by a post 520 to switching circuitry (not shown) under the memory structure 500. Additional switching circuitry (not shown) used for both reading and writing is connected to conductor 310.

In an exemplary implementation, access to each memory cell 350 can be controlled by a separate switching circuit interfaced to post 520. In another exemplary implementation, access to multiple memory cells 350 can be controlled by a switching circuit interfaced to post 520. The more memory cells being controlled by a given switching circuit, the more area one has to build additional circuitry under the memory cells. The number of memory cells to be controlled by a switching circuit depends on design choice.

In an exemplary implementation, the switching circuit interfaced to post 520 comprises at least a transistor that turns on/off a current to be applied to the memory cell 350 during read/write operations. For example, during a write operation, the switching circuit turns on a current to be applied to the memory cell 350 via the post 520 and the read conductor 510 to activate heating in the memory cell 350. The applied current is sufficient to heat the memory cell 350 to an elevated temperature, so that magnetic fields generated by a write current applied in the write conductor 310 can switch the magnetic orientation of the memory cell 350. However, the memory cell 350 should not be overheated as to irreversibly alter its magnetization properties. In an exemplary implementation, the write current may be maintained for some time during a write operation until the written memory cell 350 cools to a magnetically stable temperature.

During a read operation, the switching circuit turns on a small current to be applied to the memory cell 350 via the post 520 and the read conductor 510 to determine the resistance in the memory cell 350. In an exemplary implementation, the current applied to the memory cell 350 during a read operation exits through the write conductor 310, which acts as a sense line during the read operation and is connected to standard sense circuitry (not shown).

Figure 6:
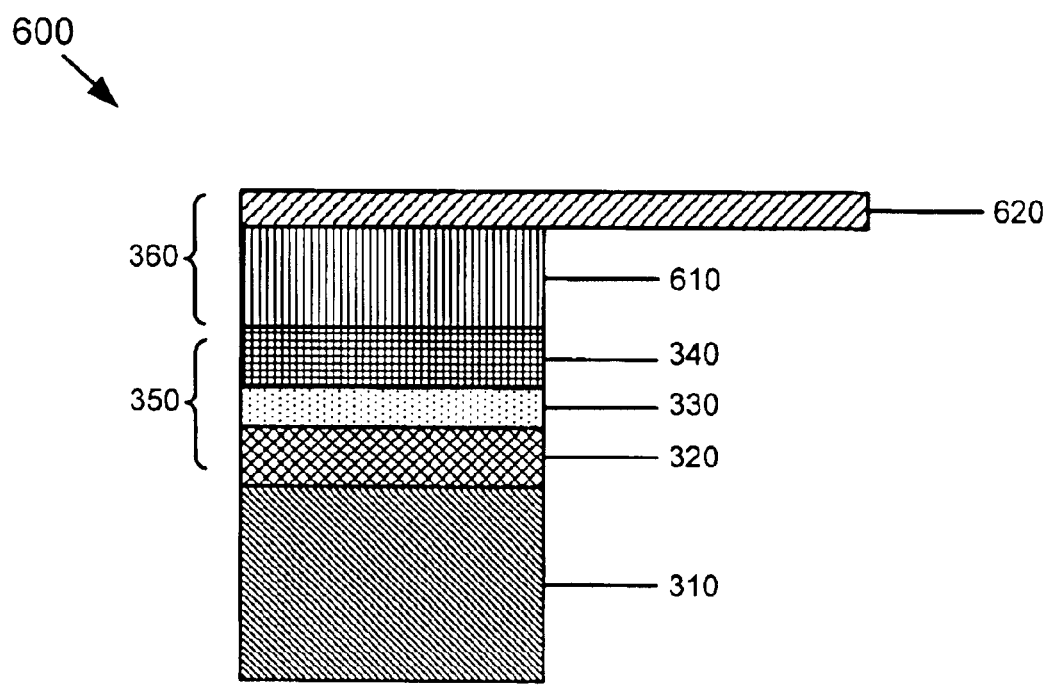
FIG. 6 illustrates another exemplary thermally-assisted magnetic memory structure implementing a third exemplary heating system.

V. An Exemplary Thermally-Assisted Magnetic Memory Structure Implementing a Third Exemplary Heating System FIG. 6 illustrates an exemplary thermally-assisted magnetic memory structure 600 implementing a third exemplary heating system. The memory structure 600 includes a write conductor 310, a memory cell 350 contacting the write conductor 310, and a heating system 360 contacting the memory cell 350. In this exemplary implementation, the heating system 360 comprises a heater 610 in series with the memory cell 350 and a read conductor 620 contacting the heater 610 and connecting to switching circuitry (not shown) for controlling currents to be applied to the memory cell 350. Exemplary structures for the heater 610 include, without limitation, an insulating tunnel barrier, a semiconductor-rich insulator layer, a semiconductor layer, a high resistivity layer and/or other structures. Exemplary materials for an insulating tunnel barrier are AlOx, AlNx, SiOx, SiNx and MgO, for a semiconductor-rich insulator are silicon-rich oxides and silicon-rich nitrides, for a semiconductor layer are silicon and germanium, and for a high resistivity layer are TaSiN, WSiN, TaN and WN. In an exemplary implementation, he resistance of heater 610 when in the read mode is small enough (e.g., less than 50% of the resistance of the magnetic memory cell) to minimize signal loss associated with the heater series resistance. When in the write mode, the resistance of the heater can be greater than that of the memory cell.

In an exemplary implementation, each memory cell 350 can be controlled by a separate switching circuit. In another exemplary implementation, multiple memory cells can be controlled by a common switching circuit. The switching circuits may be located at the outer edges of the array of memory cells or underneath the memory cells.

In an exemplary implementation, the switching circuit comprises at least a transistor that turns on/off a current to be applied to the memory cell 350 during read/write operations. For example, during a write operation, the switching circuit turns on a current to be applied to the heater 610 via the read conductor 620. The applied current may be sufficient to heat the heater 610 to an elevated temperature. The memory cell 350 itself may also be self-heating. The heat provided by the heater 610 (in combination with any heat generated by the memory cell 350) elevates the temperature in the memory cell 350 so that magnetic fields generated by a write current applied in the write conductor 310 can switch the magnetic orientation of the memory cell 350. However, the memory cell 350 should not be overheated as to irreversibly alter its magnetization properties. In an exemplary implementation, the write current may be maintained for some time during a write operation until the written memory cell 350 cools to a magnetically stable temperature.

During a read operation, the switching circuit turns on a small current to be applied to the memory cell 350 via the read conductor 620 to determine the resistance in the memory cell 350. In an exemplary implementation, the current applied to the memory cell 350 during a read operation exits through the write conductor 310, which acts as a sense line during the read operation and is connected to standard sense circuitry (not shown).

VI. Conclusion

The foregoing examples illustrate certain exemplary embodiments from which other embodiments, variations, and modifications will be apparent to those skilled in the art. The inventions should therefore not be limited to the particular embodiments discussed above, but rather are defined by the claims.

What is claimed is:

1. An array of thermally-assisted magnetic memory structures, each of said magnetic memory structures comprising:
   a memory cell, said memory cell comprising a data layer, a spacer layer, and a reference layer;
   a write conductor contacting said memory cell, said write conductor selecting said memory cell in a first coordinate during a write operation; and
   a heating system contacting said memory cell, said heating system:
      heating said memory cell during said write operation; and
      selecting said memory cell by said heating in a second coordinate.

2. The magnetic memory structure of claim 1, wherein at least a portion of said write conductor is surrounded by a cladding.

3. The magnetic memory structure of claim 2, wherein said cladding comprises a ferromagnetic material.

4. The magnetic memory structure of claim 1, wherein said write conductor is configured to act as a sense line during a read operation.

5. The magnetic memory structure of claim 1, wherein the coercivity of said data layer is reduced when the temperature of said data layer is increased.

6. The magnetic memory structure of claim 1, wherein the data layer comprises a ferromagnetic layer contacting an antiferromagnetic layer.

7. The magnetic memory structure of claim 1, wherein said heating system enables said memory cell to attain an elevated temperature to facilitate switching of a magnetic orientation of said memory cell by a write current applied in said write conductor.

8. The magnetic memory structure of claim 1, wherein magnetic fields generated by said heating system are combined with magnetic fields generated by a write current applied in said write conductor during a write operation, to switch a magnetic orientation of said memory cell.

9. The magnetic memory structure of claim 1, wherein said heating system comprises a heater line.

10. The magnetic memory structure of claim 1, wherein said heating system comprises a read conductor and a switching circuit.

11. The magnetic memory structure of claim 1, wherein said heating system is configured to act as a read conductor during a read operation.

12. The magnetic memory structure of claim 1, wherein said heating system comprises a heater, a read conductor, and a switching circuit.

13. The magnetic memory structure of claim 1, wherein said heating system comprises a heater in series with the memory cell.

14. The magnetic memory structure of claim 1, wherein said heating system comprises said magnetic memory cell.

15. The magnetic memory structure of claim 1, wherein said heating system contacts a plurality of memory cells.

16. A method for writing data to a thermally-assisted magnetic memory cell in an array of memory cells, comprising
   heating a selected memory cell, said memory cell comprising a data layer, a spacer layer, and a reference layer;
   applying a write current through a single write conductor adjacent to said selected memory cell, said write current generating a magnetic field to switch the magnetic state of said selected memory cell; and
   removing said write current from said selected memory cell.

17. The method of claim 16, wherein said heating comprises applying a current through said selected memory cell.

18. The method of claim 16, wherein said heating comprises applying a current through a heater line.

19. The method of claim 16, wherein said heating comprises elevating the temperature of said selected memory cell so that said write current through said single write current is sufficient to switch the magnetic state of said selected memory cell.

20. The method of claim 16, wherein said write current is maintained until said selected memory cell cools to a magnetically stable temperature.

21. A method for making a thermally-assisted magnetic memory structure, comprising:
   forming a memory cell, said memory cell comprising, a data layer, a spacer layer, and a reference layer;
   forming a write conductor contacting said memory cell, said write conductor selecting said memory cell in a first coordinate during a write operation; and
   forming a heating system contacting said memory cell, said heating system:
      heating said memory cell during said write operation; and
      selecting said memory cell by said heating in a second coordinate.

22. The method of claim 21, wherein at least a portion of said write conductor is surrounded by a cladding.

23. The method of claim 22, wherein said cladding comprises a ferromagnetic.

24. The method of claim 21, wherein said write conductor is configured to act as a sense line during a read operation.

25. The method of claim 21, wherein said forming said memory cell comprises forming a data layer, forming a spacer layer contacting said data layer, and forming a reference layer contacting said spacer layer.

26. The method of claim 21, wherein said heating system enables said memory cell to attain an elevated temperature to facilitate switching of the magnetic orientation of said memory cell by a write current applied in said write conductor.

27. The method of claim 21, wherein magnetic fields generated by said heating system are combined with magnetic fields generated by a write current applied in said write conductor during a write operation, to switch a magnetic orientation of said memory cell.

28. The method of claim 21, wherein said forming a heating system comprises forming a heater line.

29. The method of claim 21, wherein said forming a heating system comprises forming a read conductor and forming a switching circuit connected to said read conductor.

30. The method of claim 21, wherein said heating system is configured to act as a read conductor during a read operation.

31. The method of claim 21, wherein said forming a heating system comprises forming a heater, forming a read conductor contacting said heater, and forming a switching circuit connected to said read conductor.

32. The method of claim 21, wherein said forming a heating system comprising enabling said heating system to provide heat to at least one memory cell.

33. A nonvolatile memory array comprising a plurality of thermally-assisted magnetic memory structures, each of said magnetic memory structures being made by a process comprising:

a forming memory cell, said memory cell comprising a data layer, a spacer layer, and a reference layer;

forming a write conductor contacting said memory cell, said write conductor selecting said memory cell in a first coordinate during a write operation; and forming a heating system contacting said memory cell, said heating system:

heating said memory cell during said write operation; and selecting said memory cell by said heating in a second coordinate.

* * * * *